United States Patent
Shim et al.

(10) Patent No.: US 6,802,445 B2
(45) Date of Patent: Oct. 12, 2004

(54) COST EFFECTIVE SUBSTRATE FABRICATION FOR FLIP-CHIP PACKAGES

(75) Inventors: Il Kwon Shim, Singapore (SG); Jian Jun Li, Singapore (SG); Sheila Marie Alvarez, Singapore (SG)

(73) Assignee: St Assembly Test Services Pte. Ltd., Singapore (SG)

( * ) Notice: Subject to any disclaimer, the term of this patent is extended or adjusted under 35 U.S.C. 154(b) by 118 days.

(21) Appl. No.: 10/279,900

(22) Filed: Oct. 24, 2002

(65) Prior Publication Data

US 2004/0079788 A1 Apr. 29, 2004

(51) Int. Cl.⁷ .............................................. B23K 31/02
(52) U.S. Cl. .................................. 228/123.1; 228/215
(58) Field of Search .............................. 228/215, 165, 228/248.1, 180.1, 180.21, 180.22, 123.1; 219/121.7, 121.71, 121.72; 29/846, 847, 852

(56) References Cited

U.S. PATENT DOCUMENTS

| | | | |
|---|---|---|---|
| 3,719,981 A | * | 3/1973 | Steitz .......................... 438/616 |
| 6,255,039 B1 | * | 7/2001 | Xu et al. ..................... 430/318 |
| 6,649,864 B2 | * | 11/2003 | De Steur et al. ........ 219/121.71 |
| 6,673,710 B1 | * | 1/2004 | Lin ............................. 438/611 |
| 2003/0192182 A1 | * | 10/2003 | Hiramatsu et al. ............ 29/852 |
| 2004/0033444 A1 | * | 2/2004 | Otoguro et al. ............. 430/312 |
| 2004/0112944 A1 | * | 6/2004 | Tong et al. .................. 228/215 |

* cited by examiner

Primary Examiner—Kiley Stoner
Assistant Examiner—Jonathan Johnson

(57) ABSTRACT

A new method is provided for the creation of high-accuracy and low-accuracy openings overlying points of electrical access over the surface of a semiconductor device supporting substrate. Openings are first created for access to the substrate followed by copper plating and then patterning of the plated layer of copper, creating the interconnect metal over the surface of the substrate. A first solder mask is coated over the surface of the substrate, this first solder mask must be provided with a first array of low-accuracy openings for electrical access there-through for the placement of contact balls. The first openings can be created using conventional film artwork since low accuracy is required for the contact ball openings, resulting in a low-cost process for the creation of the first openings. A second solder mask is next coated over the surface of the first solder mask. Through this second solder mask is created a second array of high-accuracy second openings that provide access to solder bumps using methods of laser ablation, resulting in a low-throughput process which however is only applied to create access to solder bumps.

39 Claims, 3 Drawing Sheets

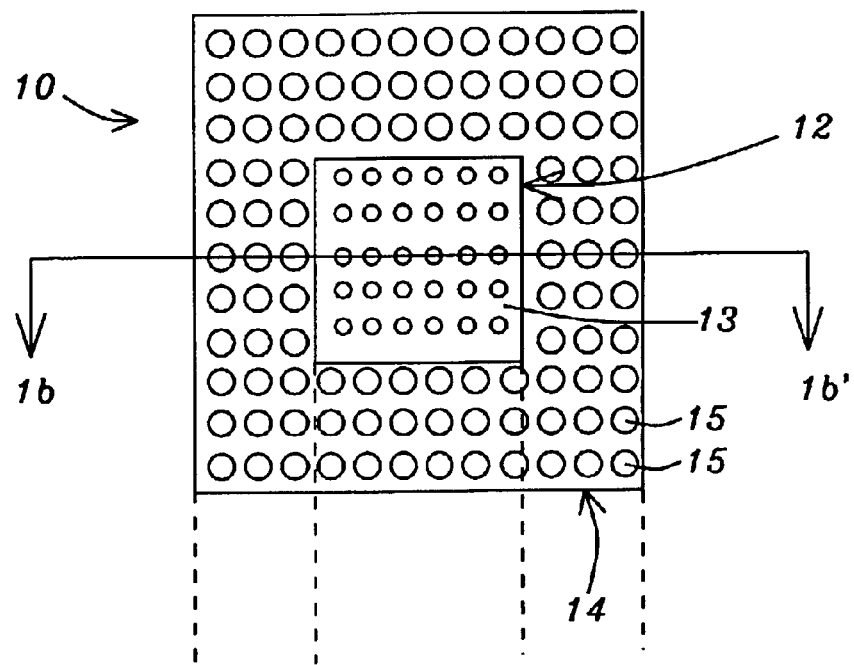
FIG. 1a - Prior Art
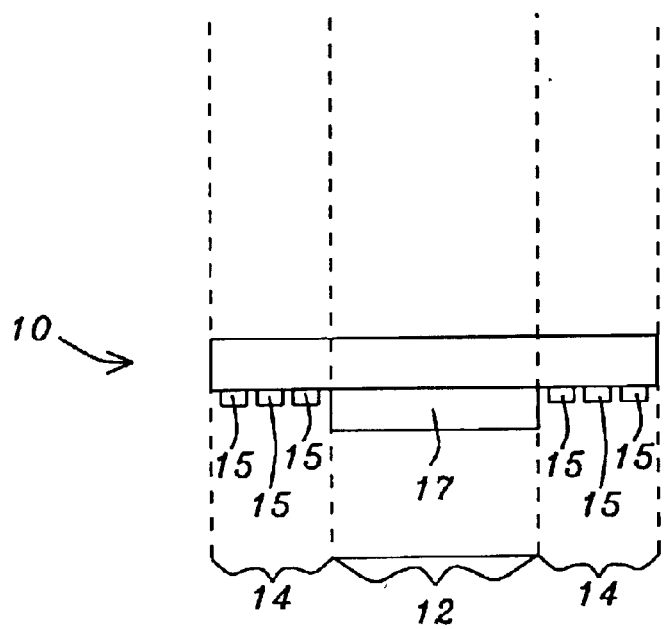
FIG. 1b - Prior Art

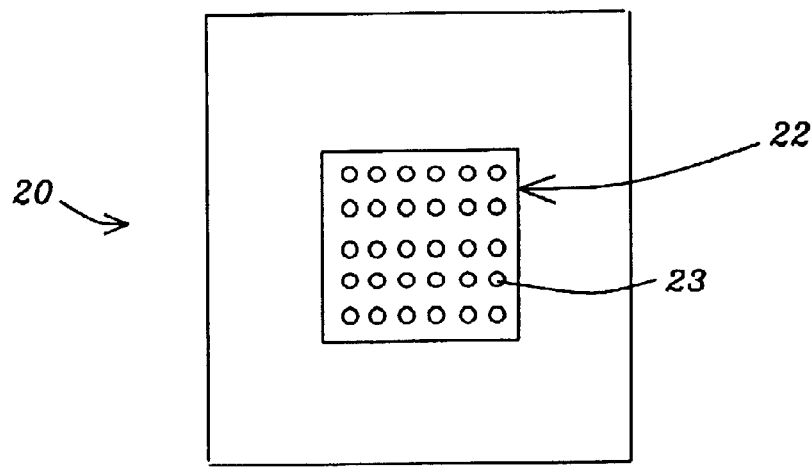
FIG. 2a – Prior Art
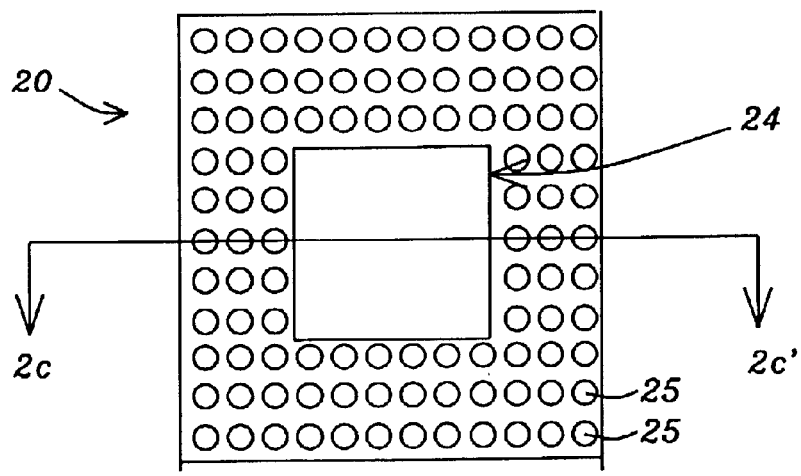
FIG. 2b – Prior Art
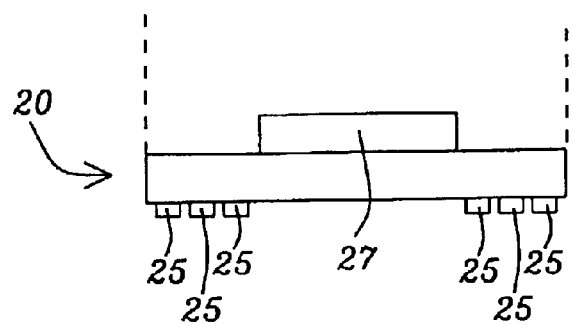
FIG. 2c – Prior Art

COST EFFECTIVE SUBSTRATE FABRICATION FOR FLIP-CHIP PACKAGES

BACKGROUND OF THE INVENTION (1) Field of the Invention

The invention relates to the fabrication of integrated circuit devices, and more particularly, to a cost-effective method of creating a substrate that can be applied for flip-chip packages.

(2) Description of the Prior Art

High density interconnect technology frequently leads to the fabrication of multilayer structures in order to connect closely spaced integrated circuits with each other. A single substrate serves as an interconnect medium to which multiple chips are connected, forming a device package with high packaging density and dense chip wiring. The metal layers that make up the interconnect network and the via and contact points that establish connections between the interconnect networks are separated by layers of dielectric (such as polyimide) or insulating layers. In the design of the metal interconnects, strict rules must be adhered to in order to avoid problems of package performance and reliability. For instance, the propagation directions of primary signal lines must intersect under angles of 90 degrees to avoid electrical interference between adjacent lines. It is further required that, for considerations of photolithography and package reliability, planarity is maintained throughout the construction of multi-layer chip packages. Many of the patterned layers within an interconnect network form the base for subsequent layers, their lack of planarity can therefore have a multiplying effect of poor planarity on overlying layers.

Quad Flat Packages (QFP) have in the past been used to create surface mounted, high pin count integrated packages with various pin configurations. The electrical connections with these packages are typically established by closely spaced leads that are distributed along the four edges of the flat package. This limits the usefulness of the QFP since a high input/output (I/O) count cannot be accommodated in this manner. To address this problem, the Ball Grid Array (BGA) package has been created whereby the I/O points for the package are distributed not only around the periphery of the package but over the complete bottom of the package. The BGA package can therefore support more I/O points, making this a more desirable package for high circuit density with high I/O count. The BGA contact points are solder balls that in addition facilitate the process of flow soldering of the package onto a printed circuit board. The solder balls can be mounted in an array configuration and can use 40, 50 and 60 mil spacings in a regular or staggered pattern.

Increased input/output (I/O) requirements combined with increased performance requirements for high performance Integrated Circuits (IC's) has led to the development of Flip Chip packages. Flip chip technology fabricates bumps (typically Pb/Sn solder) on Al pads and interconnects the bumps directly to the package media, which are usually ceramic or plastic based. The flip-chip is bonded face down to the package through the shortest paths. These technologies can be applied not only to single-chip packaging, but also to higher or integrated levels of packaging, in which the packages are larger, and to more sophisticated package media that accommodate several chips to form larger functional units. The flip-chip technique, using an area array, has the advantage of achieving the highest density of interconnection to the device combined with a very low inductance interconnection to the package.

It is the objective of packaging ball grid array and flip-chip packages that the chip is mounted on the surface of a package substrate. The contact points of the flip-chip Integrated Circuit (IC) device make contact with contact points in the top surface of the Ball Grid Array (BGA) substrate, the substrate re-distributes (fan-out) the flip-chip IC contact points. The lower surface of the substrate has the contact point (balls) that are connected to the surrounding circuitry and that form the interface between the BGA/flip-chip IC contact balls and this surrounding circuitry. It must thereby also be understood that the original contact balls of the flip chip IC device are encased in a material (for instance epoxy) for protection of these balls. The epoxy is encased between the lower surface of the flip-chip IC device and the upper surface of the BGA substrate. This epoxy layer is referred to as underfill since it is filled in under the flip-chip device. The underfill is normally put in place using a separate process of dispensing epoxy liquid under the die followed by curing of the epoxy. IC devices that are packaged using a flip chip and that have requirements of high power dissipation normally require a heatsink that is attached to the surface of the flip chip die. Only the backside of the flip chip is exposed and is suitable for the attachment of the heatsink. Since the heatsink is only attached to the (backside) surface of the IC device, great care must be taken not to induce stress on the backside of the IC device. If too much force or stress is used during the process of attaching the heatsink to the die, the die can easily crack or break. If on the other hand a larger surface area is created that is parallel to the surface of the backside of the IC device, the stress can be significantly reduced.

Existing solder-mask coating for a flip-chip substrate and the formation of a pattern of openings thereto uses either techniques of Photo-imageable Solder Resist (PSR) or thermally cured ink with laser ablation for both solder bump and contact ball pads. The creation of solder bump pad openings and the creation of PSR openings require significantly different levels of accuracy, with a process requiring a higher level of accuracy typically being characterized by low productivity and high cost. The invention provides a cost-effective and reliable method that addresses these concerns.

SUMMARY OF THE INVENTION

A principle objective of the invention is to provide a method of creating a substrate for application in a flip-chip package that is cost effective and reliable.

Another objective of the invention is to apply the creation of high-accuracy and low-accuracy openings overlying points of electrical access over the surface of a semiconductor device supporting substrate in a cost-effective and reliable manner.

In accordance with the objectives of the invention a new method is provided for the creation of high-accuracy and low-accuracy openings overlying points of electrical access over the surface of a semiconductor device supporting substrate. Openings are first created for access to the substrate followed by copper plating and then patterning of the plated layer of copper, creating the interconnect metal over the surface of the substrate. A first solder mask is coated over the surface of the substrate, this first solder mask must be provided with a first array of low-accuracy openings for electrical access there-through for the placement of contact balls. The first openings can be created using conventional film artwork since low accuracy is required for the contact ball openings, resulting in a low-cost process for the creation of the first openings. A second solder mask is next coated over the surface of the first solder mask. Through this second solder mask is created a second array of high-accuracy second openings that provide access to solder bumps using methods of laser ablation, resulting in a low-throughput process which however is only applied to create access to solder bumps.

BRIEF DESCRIPTION OF THE DRAWINGS

FIGS. 1a and 1b show a top view and a cross section of a prior art substrate and die-down mounting of a flip chip over the surface thereof.

FIGS. 2a through 2c show a top view, a bottom view and a cross section of a prior art substrate and die-up mounting of a flip chip over the surface thereof.

DESCRIPTION OF THE PREFERRED EMBODIMENTS

Figure 3:
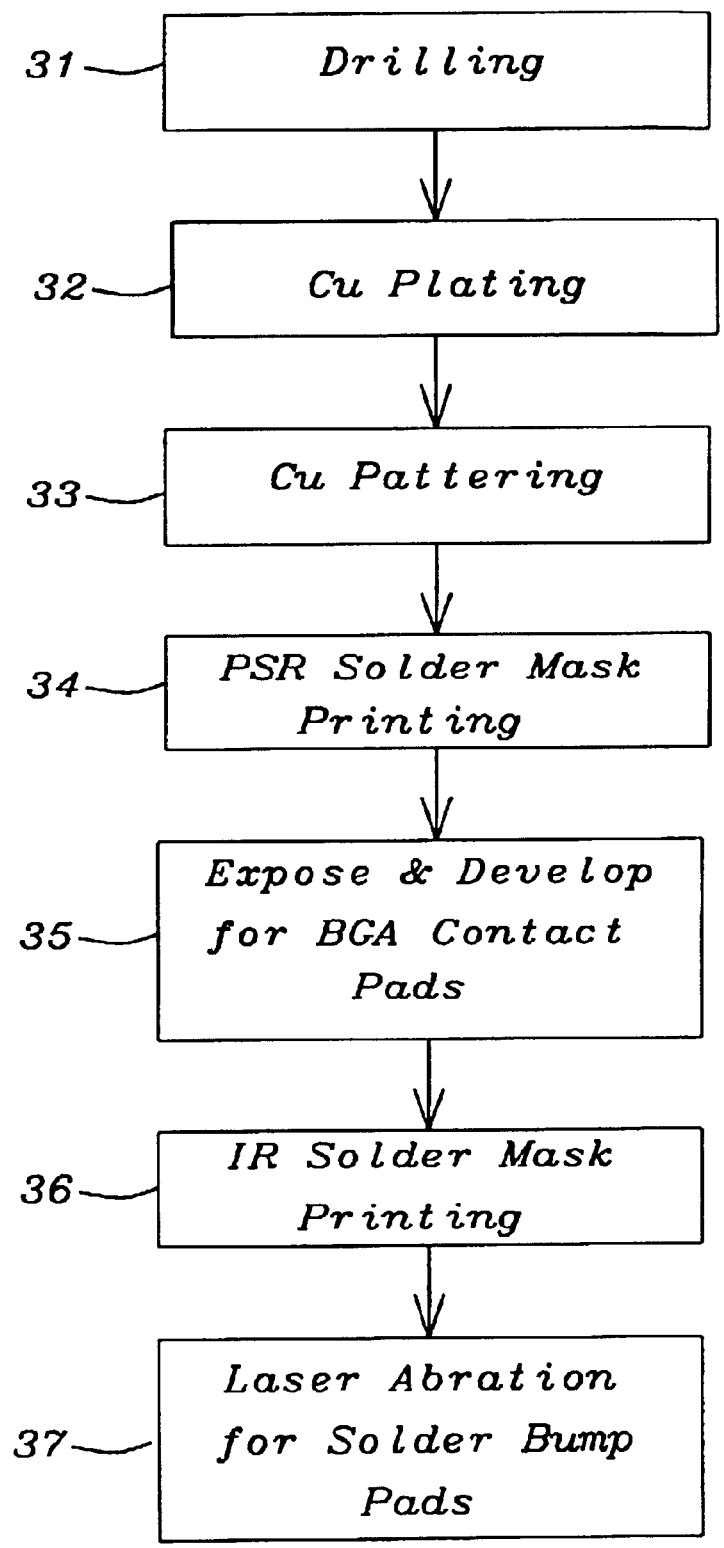
FIG. 3 shows a flowchart of the processing sequence of the invention.

For a better understanding of the invention, the various methods of mounting a flip-chip over the surface of a semiconductor device supporting substrate must first be highlighted. For this the FIGS. 1a through 2c are used.

Flip-chips can be mounted over a supporting substrate in one of two ways:

1. the solder bumps of the flip-chip faces the substrate with the flip being mounted over the surface of the substrate and BGA contact ball contact points being provided over the surface of the substrate on which the flip chip is mounted, the so-called die-down method of mounting a flip-chip, or
2. the solder bumps of the flip-chip faces a first surface of the substrate, BGA contact ball contact points are provided over a second surface of the substrate which is opposite to the first surface of the substrate, the so-called die-up method of mounting a flip-chip.

FIGS. 1a and 1b address the die-down method of mounting a flip-chip over the surface of a substrate. Shown in FIG. 1a is a top view of the substrate 10 over the surface of which a flip-chip (not shown) is mounted whereby the solder bumps of the flip chip make direct contact with the surface of the substrate in surface area 12. A contact point 13 for a solder bump, which is provided over the active surface of the flip-chip, is shown as a representative example of the contact points for the flip chip that are provided over the surface area 12 of the substrate 10. Additional electrical contact to substrate 10 is provided in surface area 14 of substrate 10. This electrical contact to surface area 14, which surrounds the surface area 12 within the bounds of the substrate 10, is provided by contact balls. A contact point 15 for a contact ball (not shown), provided over the surface are 14 of substrate 10, is shown as a representative example of the contact points for contact balls that provide further access to substrate 10. It must thereby be understood that, internal to substrate 10, a number of layers may be patterned that provided for effective routing of interconnect metal to the flip chip that is mounted over the surface of substrate 10.

To better understand the mounting of the flip-chip, the cross section that is shown in FIG. 1b, taken along the line 1b–1b' shown in FIG. 1a, is shown. Contact pads 15 for the contact balls 15 have been highlighted in FIG. 1b as has the flip chip 17 mounted over the surface of substrate 10.

Relating to FIGS. 1a and 1b, the following can be observed:

for surface area 12 of the substrate 10, the points of electrical contact must be aligned with solder bumps provided over the active surface of the flip chip 17, these points of electrical contact and their corresponding openings created through an overlying solder mask must therefore be created using high-accuracy of placement. Typical tolerance for these openings is ±25 µm. These contact openings 13 are therefore created user laser ablation technology, and for surface area 14 of the substrate 10, the points of electrical contact do not need to be accurately aligned over the surface of the substrate 10, these points of electrical contact and their corresponding openings created through an overlying solder mask can therefore be created using low high-accuracy of placement. Typical tolerance for these openings is ±65 µm. These contact openings 15 are therefore created user photolithography (photo-imaging) technology.

It must be pointed out that, for the cross section shown in FIG. 1b, it is also possible to provide contact balls over the lower surface of the substrate 10, that is the surface opposite the surface of substrate 10 over which (in the cross section of FIG. 1b) flip-chip 17 is mounted. These contact pads have not been highlighted in the cross section of FIG. 1b and can be provided over the entire surface of the lower surface of substrate 10. Considerations of accuracy of placement of these latter contact points are the same as the above highlighted considerations for the placement of contact pads and access thereto for surface area 14 of substrate 10.

FIGS. 2a–2c address the die-up mounting of a flip chip over the surface of a substrate.

Shown in FIG. 2a is the top view of the upper surface of the substrate 20, that is the surface over which a flip-chip 27 is mounted in a die-up position. For surface area 22 of the top view of substrate 20, the access points 23 for flip chip solder bumps (not shown) must align with the solder bumps and must therefore be created using close tolerances and by applying laser ablation technology.

For the solder mask created over the lower or bottom surface of the substrate, as shown in top view in FIG. 2b, the contact balls and the therefore created contact points through a solder mask requires relatively low-accuracy placement and can therefore be created using photo-imaging technology. The surface area 24 surrounds the surface area 22 and is bounded by the circumference of substrate 20. The element that has been highlighted as element 25 is a representative of a contact ball access point that must be provided over the surface area 24. FIG. 2c shows a cross section of substrate 20, taken along line 2c–2c' of FIG. 2b. Flip chip 27 is now mounted over the upper surface of substrate 20 in a die-up position.

The following can be summarized based on the above shown FIGS. 1a–2c:

high accuracy openings are created using laser technology, also referred to as Infra Red (IR) technology low accuracy openings are created using photo-imaging technology IR technology applies IR solder mask printing, that is uses a solder mask that is sensitive to IR exposure Photo-imaging technology applies PSR solder mask printing, that is uses a solder mask that is sensitive to photolithographic exposure High accuracy creation of openings through a solder mask has a tolerance of ±25 µm, this tolerance applies both to the location of the created opening and to the size of the created opening Low accuracy creation of openings through a solder mask has a tolerance of ±60 µm, this tolerance applies both

- to the location of the created opening and to the size of the created opening
- Openings through a solder mask that must align with flip-chip solder bumps require high accuracy in their creation
- Openings through a solder mask that must align with contact balls require low accuracy in their creation
- The creation of high accuracy openings and low accuracy openings can be performed sequentially and as separate processes
- The creation of high accuracy openings brings with it high cost, and
- The creation of low accuracy openings brings with it low cost.

Conventionally, the creation of high-accuracy openings and low-accuracy openings has not been separated.

As a first for instance, for the creation of PSR solder mask (low accuracy) openings has been applied a highly accurate glass mask, the exposed resist has then be developed for both the (high accuracy) solder bumps and the (low accuracy) contact ball BGA contact pad, resulting in low productivity and high cost.

As a second for instance, IR solder mask openings have been created using (high accuracy) laser ablation for both the (high accuracy) solder bump openings and the (low accuracy) contact balls BGA openings through the solder mask, resulting in low productivity and very high production cost.

The invention provides a cost-effective method for the creation of solder masks over the surface of a semiconductor device supporting substrate by:

1. Providing for the creation of low-tolerance, high accuracy openings to solder bumps using an IR solder mask with laser technology, and
2. Providing for the creation of high-tolerance, low accuracy openings to contact balls BGA contact pads using photo-imaging technology.

The processing steps that are provided by the invention are highlighted using the flowchart of FIG. 3 for this purpose.

Shown in the flowchart of FIG. 3 are the following steps:

step 31, holes are drilled through the substrate where these holes are required and based on the design and layout of the substrate step 32, a layer of copper is provided over the surface of the substrate, this layer of copper serves as a base for the formation of interconnect traces over a surface of the substrate in addition to interconnecting opposing contact pads, provided over a first and a second surface of the substrate, and interconnected by the openings drilled through the substrate step 33, the deposited layer of copper is patterned and etched, creating copper interconnect traces over a surface of the substrate which may of may not be connected to the interconnects created through openings drilled through the substrate step 34, a first solder mask, comprising a (low accuracy, low cost) PSR solder mask, is coated over the surface of the substrate, including the surface of the thereover created interconnect traces; the PSR solder mask is provided only over the surface areas of the substrate over which access to BGA contact pads is to be provided step 35, the coated first solder mask is exposed and developed, preferably using photo-imaging technology, for the exposure of BGA contact pads provided over the surface of the substrate step 36, a second solder mask, comprising a (high accuracy, high cost) IR solder mask, is coated over the surface of the first solder mask; the IR solder mask is provided only over the surface areas of the substrate over which access to solder bumps is to be provided step 37, the coated second solder mask is exposed and developed, preferably using laser technology, for the exposure of solder bumps contacts provided over the surface of the substrate.

To summarize the invention:
- separates the creation of low-tolerance openings from the creation of high tolerance openings
- enables providing high throughput using conventional photo-imaging for the creation of high-tolerance, low-accuracy openings through a solder mask, resulting in reduced production cost, and
- enables limiting the impact of the low throughput process that is conventionally required for the creation of low-tolerance, high-accuracy opening through a solder mask.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating solder masks providing both high accuracy and low accuracy there-through, comprising steps of:

providing a semiconductor device supporting substrate for purposes of mounting at least one flip chip over the surface thereof, said substrate having been provided with interconnect metal through and over at least one surface thereof, said interconnect metal comprising first points of access thereto of high tolerance in diameter and placement contact balls in addition to second points of access thereto of low tolerance in diameter and placement solder bumps;

depositing a first layer of solder mask material over said first points of access;

first creating first openings through said first layer of solder mask material, exposing said first points of access;

depositing a second layer of solder mask material over said second points of access; and second creating second openings through said second layer of solder mask material, exposing said second points of access.

2. The method of claim 1, said contact balls comprising Ball Grid Array contact balls.

3. The method of claim 1, said first layer of solder mask material comprising a Photo-imageable Solder Resist.

4. The method of claim 1, said first creating first openings through said first layer of solder mask material comprising methods of Photo-imageable Solder Resist exposure and development.

5. The method of claim 1, said second layer of solder mask material comprising a Infra Red (IR) solder mask.

6. The method of claim 1, said second creating second openings through said second layer of solder mask material comprising methods of laser ablation.

7. A method of reducing cost of creating a substrate for mounting flip devices over the surface thereof, comprising steps of:
- providing a semiconductor device supporting substrate for purposes of mounting at least one flip chip over the surface thereof;
- creating high tolerance openings through a layer of first solder mask material deposited over the surface of said substrate; and
- creating low tolerance openings through a layer of second solder mask material deposited over the surface of said substrate.

8. The method of claim 7, said substrate having been provided with a layer of interconnect metal through and over a surface thereof, said layer of interconnect metal comprising:
- (i) first points of access; and
- (ii) second points of access.

9. The method of claim 8, said first points of access comprising access to contact balls having high tolerance in diameter and placement.

10. The method of claim 8, said second points of access comprising access to solder bumps having low tolerance in diameter and placement.

11. The method of claim 7, said creating high tolerance openings through a first layer of solder mask material deposited over the surface of said substrate comprising steps of:
- depositing a first layer of solder mask material over first points of access; and
- first creating first openings through said first layer of solder mask material, exposing first points of access.

12. The method of claim 7, said creating low tolerance openings through a second layer of solder mask material deposited over the surface of said substrate comprising steps of:
- depositing a second layer of solder mask material over second points of access; and
- second creating second openings through said second layer of solder mask, exposing second points of access.

13. The method of claim 9, said contact balls comprising Ball Grid Array contact balls.

14. The method of claim 11, said first layer of solder mask material comprising a Photo-imageable Solder Resist.

15. The method of claim 11, said first creating first openings through said first solder mask comprising methods of Photo-imageable Solder Resist exposure and development.

16. The method of claim 12, said second layer of solder mask material comprising a Infra Red (IR) solder mask.

17. The method of claim 12, said second creating second openings through said second layer of solder mask material comprising methods of laser ablation.

18. The method of claim 1, said low tolerance being a tolerance of about ±25 μm in a diameter of openings for said second points.

19. The method of claim 1, said low tolerance being a tolerance of about ±25 μm in placement of openings for said second points.

20. The method of claim 7, said low tolerance being a tolerance of about ±25 μm in a diameter of openings for said second points.

21. The method of claim 7, said low tolerance being a tolerance of about ±25 μm in placement of openings for said second points.

22. The method of claim 1, said high tolerance being a tolerance of about ±65 μm in a diameter of openings for said first points.

23. The method of claim 1, said high tolerance being a tolerance of about ±65 μm in placement of openings for said first points.

24. The method of claim 7, said high tolerance being a tolerance of about ±65 μm in a diameter of openings for said first points.

25. The method of claim 7, said high tolerance being a tolerance of about ±65 μm in placement of openings for said first points.

26. A method of creating a substrate for mounting flip chip devices over the surface thereof, comprising steps of:
- providing a semiconductor device supporting substrate for purposes of mounting at least one flip chip over the surface thereof;
- drilling openings through said substrate;
- depositing a layer of copper over the surface of said substrate, filling said openings;
- patterning and etching said layer of copper, creating interconnect metal through and over the surface of said substrate, said interconnect metal comprising:
  - (i) first points of access of high tolerance; and
  - (ii) second points of access of low tolerance;
- depositing a first layer of solder mask material over the first points of access
- creating high tolerance openings through the first layer of solder mask material;
- depositing a second layer of solder mask material over the second points of access; and
- creating low tolerance openings through the second layer of solder mask material.

27. The method of claim 26, said first points of access of high tolerance comprising contact balls points of access.

28. The method of claim 26, said second points of access of low tolerance comprising solder bumps points of access.

29. The method of claim 26, said low tolerance comprising low tolerance in diameter and placement of openings for solder bumps.

30. The method of claim 26, said high tolerance comprising low tolerance in diameter and placement of openings for contact balls.

31. The method of claim 30, said contact balls comprising Ball Grid Array contact balls.

32. The method of claim 26, said first layer of solder mask material comprising a Photo-imageable Solder Resist.

33. The method of claim 26, said creating high tolerance openings through the first layer of solder mask material comprising methods of Photo-imageable Solder Resist exposure and development.

34. The method of claim 26, said second layer of solder mask material comprising a Infra Red (IR) solder mask.

35. The method of claim 26, said creating low tolerance openings through the second layer of solder mask material comprising methods of laser ablation.

36. The method of claim 26, said low tolerance being a tolerance of about ±25 μm in a diameter of openings for solder bumps.

37. The method of claim 26, said low tolerance being a tolerance of about ±25 μm in placement of openings for solder bumps.

38. The method of claim 26, said high tolerance being a tolerance of about ±65 μm in a diameter of openings for contact balls.

39. The method of claim 26, said high tolerance being a tolerance of about ±65 μm in placement of openings for contact balls.

* * * * *